United States Patent
Laskaris et al.

[11] Patent Number: 6,166,617
[45] Date of Patent: Dec. 26, 2000

[54] POLE PIECE ASSEMBLY AND OPEN MAGNET HAVING SAME

[75] Inventors: Evangelos Trifon Laskaris, Niskayuna; James Pellegrino Alexander, Ballston Lake, both of N.Y.; Delton Andrews Grey, Jr.; Greg Alan Lehmann, both of Florence, S.C.

[73] Assignee: General Electric Company, Schenectady, N.Y.

[21] Appl. No.: 09/436,831

[22] Filed: Nov. 9, 1999

[51] Int. Cl.[7] .................................................... H01F 5/00
[52] U.S. Cl. ........................ 335/299; 335/216; 324/318
[58] Field of Search ............................ 335/216, 296–299, 335/301; 324/318–320, 321

[56] References Cited

U.S. PATENT DOCUMENTS

| | | | |
|---|---|---|---|
| 4,896,128 | 1/1990 | Wollan et al. | 335/299 |
| 4,943,774 | 7/1990 | Breneman et al. | 324/318 |
| 5,384,538 | 1/1995 | Ohta et al. | 324/319 |
| 5,414,399 | 5/1995 | Breneman et al. | 335/301 |
| 5,565,831 | 10/1996 | Dorri et al. | 335/216 |
| 5,574,417 | 11/1996 | Dorri et al. | 335/216 |
| 5,874,880 | 2/1999 | Laskaris et al. | 335/216 |
| 5,874,882 | 2/1999 | Laskaris et al. | 335/299 |
| 5,883,558 | 3/1999 | Laskaris et al. | 335/216 |
| 5,923,235 | 7/1999 | Van Oort | 335/301 |
| 5,999,075 | 12/1999 | Laskaris et al. | 335/299 |

Primary Examiner—Lincoln Donovan
Assistant Examiner—Tuyen T. Nguyen
Attorney, Agent, or Firm—Martin Snyder; Douglas E. Stoner

[57] ABSTRACT

A magnet pole piece assembly has first and second pole pieces and at least one support member. The pole pieces have longitudinally aligned and facing surface recesses. The support member has a central segment and first and second end segments abuttingly and metallurgically attached to the central segment. The first and second end segments are positioned within a corresponding surface recess of the first and second pole piece and are abuttingly and metallurgically attached to the corresponding pole piece. An open magnet adds main coils to the magnet pole piece assembly.

20 Claims, 4 Drawing Sheets

FIG. 4
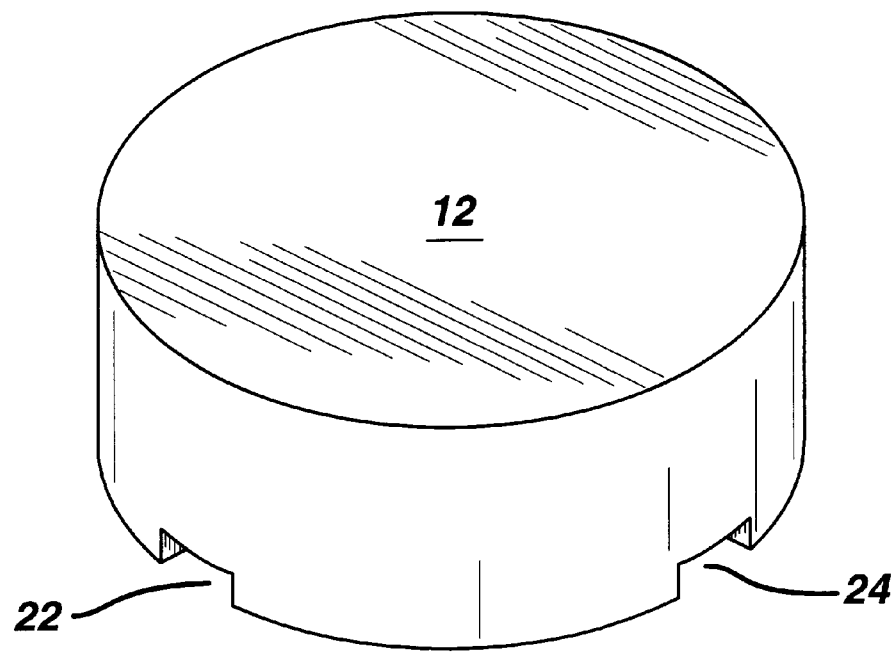
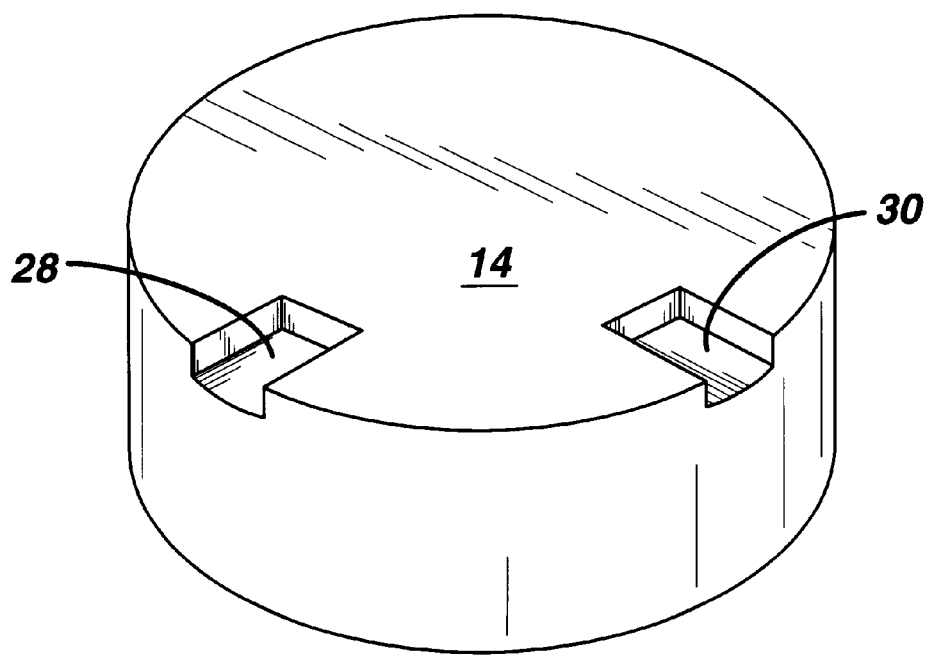

POLE PIECE ASSEMBLY AND OPEN MAGNET HAVING SAME

BACKGROUND OF THE INVENTION

The present invention relates generally to a magnet pole piece assembly, and more particularly to an open magnet having a pole piece assembly.

Magnets include resistive and superconductive magnets which are part of a magnetic resonance imaging (MRI) system used in various applications such as medical diagnostics. Known superconductive magnets include liquid-helium-cooled and cryocooler-cooled superconductive magnets. Typically, the superconductive coil assembly includes a superconductive main coil surrounded by a first thermal shield surrounded by a vacuum enclosure. A cryocooler-cooled magnet typically also includes a cryocooler coldhead externally mounted to the vacuum enclosure, having its first cold stage in thermal contact with the thermal shield, and having its second cold stage in thermal contact with the superconductive main coil. A liquid-helium-cooled magnet typically also includes a liquid-helium vessel surrounding the superconductive main coil and a second thermal shield which surrounds the first thermal shield which surrounds the liquid-helium vessel.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the magnet's bore where the object to be imaged is placed.

Open magnets, including "C" shape magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design. Hollow posts welded to the face of the vacuum enclosure provide gravity support for the coil assemblies.

It is also known in open magnet designs to place an iron pole piece in the bore of a resistive or superconductive coil assembly. The iron pole piece enhances the strength of the magnetic field and, by shaping the surface of the pole piece, magnetically shims the magnet improving the homogeneity of the magnetic field. Nonmagnetizable support posts are connected to the face of the pole pieces. Because of electromagnetic forces (em forces) from the presence of the pole pieces, the connection of the support posts to the pole pieces are subject to high stress.

What is needed is a design for a pole piece assembly, and for an open magnet having a pole piece assembly, which is better suited to an em-force environment of high stress.

BRIEF SUMMARY OF THE INVENTION

In a first expression of an embodiment of the invention, a magnet pole piece assembly includes first and second magnet pole pieces and at least one support member. The first magnetizable pole piece has at least one first surface recess, and the second magnet pole piece has at least one second surface recess generally longitudinally aligned with and facing a corresponding one of the at least one first surface recess. The at least one support member includes a central segment and first and second end segments. The first end segment has a first region which is abuttingly and metallurgically attached to the first longitudinal end of the central segment, and has a first portion which is positioned within a corresponding one of the at least one first surface recess and which is abuttingly and metallurgically attached to the first magnet pole piece. The second end segment has a second region which is abuttingly and metallurgically attached to the second longitudinal end of the central segment, and has a second portion which is positioned within a corresponding one of the at least one second surface recess and which is abuttingly and metallurgically attached to the second magnet pole piece.

In a second expression of an embodiment of the invention, an open magnet has first and second assemblies and a first support member. The first assembly has a longitudinally-extending and generally-vertically-aligned first axis and includes at least one main coil and a first magnet pole piece having a first surface recess. The second assembly has a longitudinally-extending second axis generally coaxially aligned with the first axis and includes at least one main coil and a second magnet pole piece having a second surface recess which is generally longitudinally aligned with and facing the first surface recess. The at least one support member includes a central segment and first and second end segments. The first end segment has a first region which is abuttingly and metallurgically attached to the first longitudinal end of the central segment, and has a first portion which is positioned within the first surface recess and which is abuttingly and metallurgically attached to the first magnet pole piece. The second end segment has a second region which is abuttingly and metallurgically attached to the second longitudinal end of the central segment, and has a second portion which is positioned within the second surface recess and which is abuttingly and metallurgically attached to the second magnet pole piece.

Several benefits and advantages are derived from the invention. The design avoids a high stress joint between a support member and a lower-yield-strength pole piece. The central segment of the support member may be a higher-yield-strength, nonmagnetizable material, and the first and second end segments may be a higher-yield-strength, magnetizable material so that, for example, generally full-penetration welded attachments of the end segments to the central segment provide strong joints in areas subject to high stress. The end segments are supported in the surface recesses (and hence are not subject to high stress) of the low-yield-strength, magnetizable pole pieces, so that, for example, an edge welded attachment of the end segments to the pole pieces may be used.

BRIEF DESCRIPTION OF THE DRAWINGS

FIG. 4 is a schematic, perspective view of the first and second magnet pole pieces of the magnet pole piece assembly of FIG. 2.

DETAILED DESCRIPTION OF THE INVENTION

Figure 1:
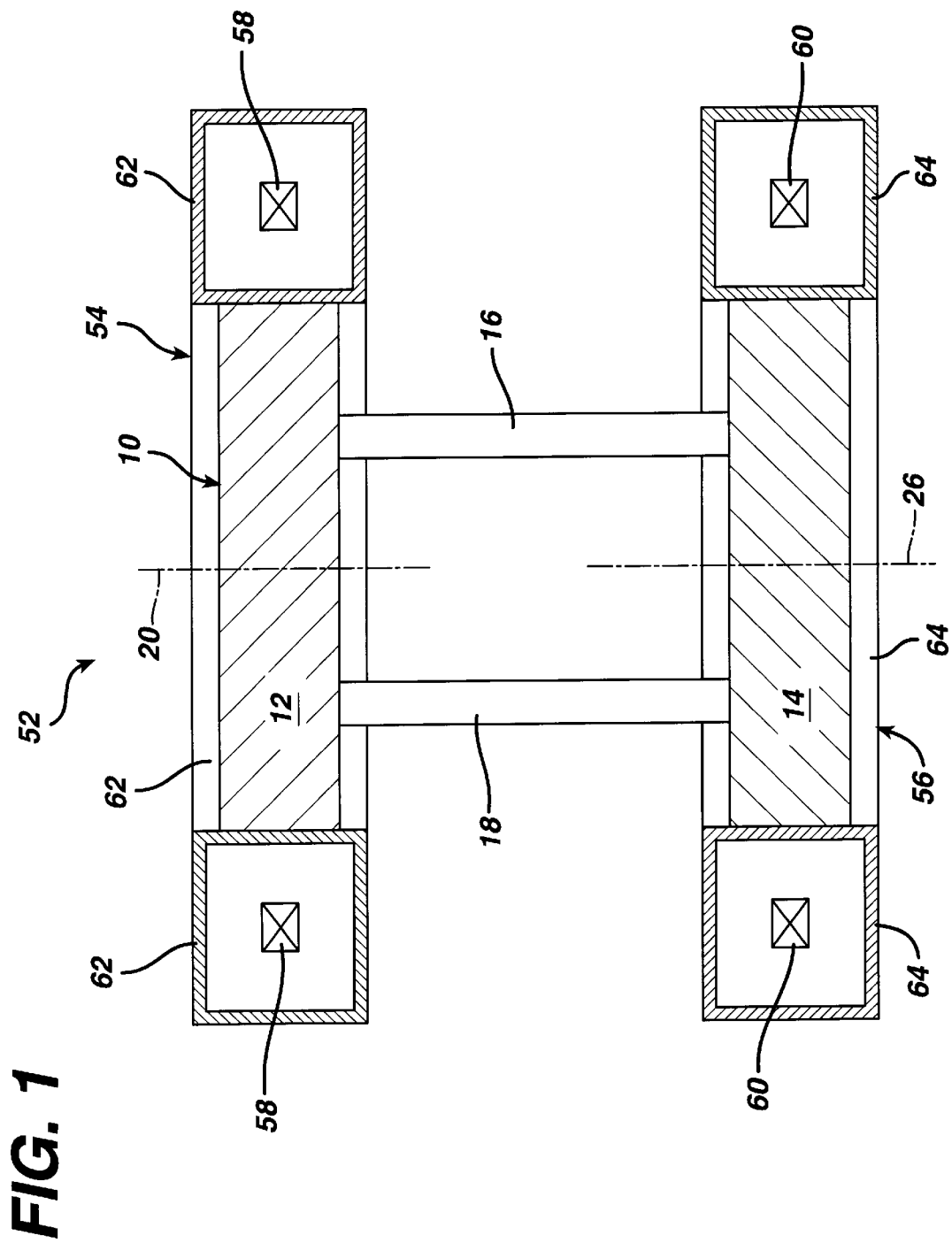
FIG. 1 is a cross-sectional view of an embodiment of the invention.
Figure 2:
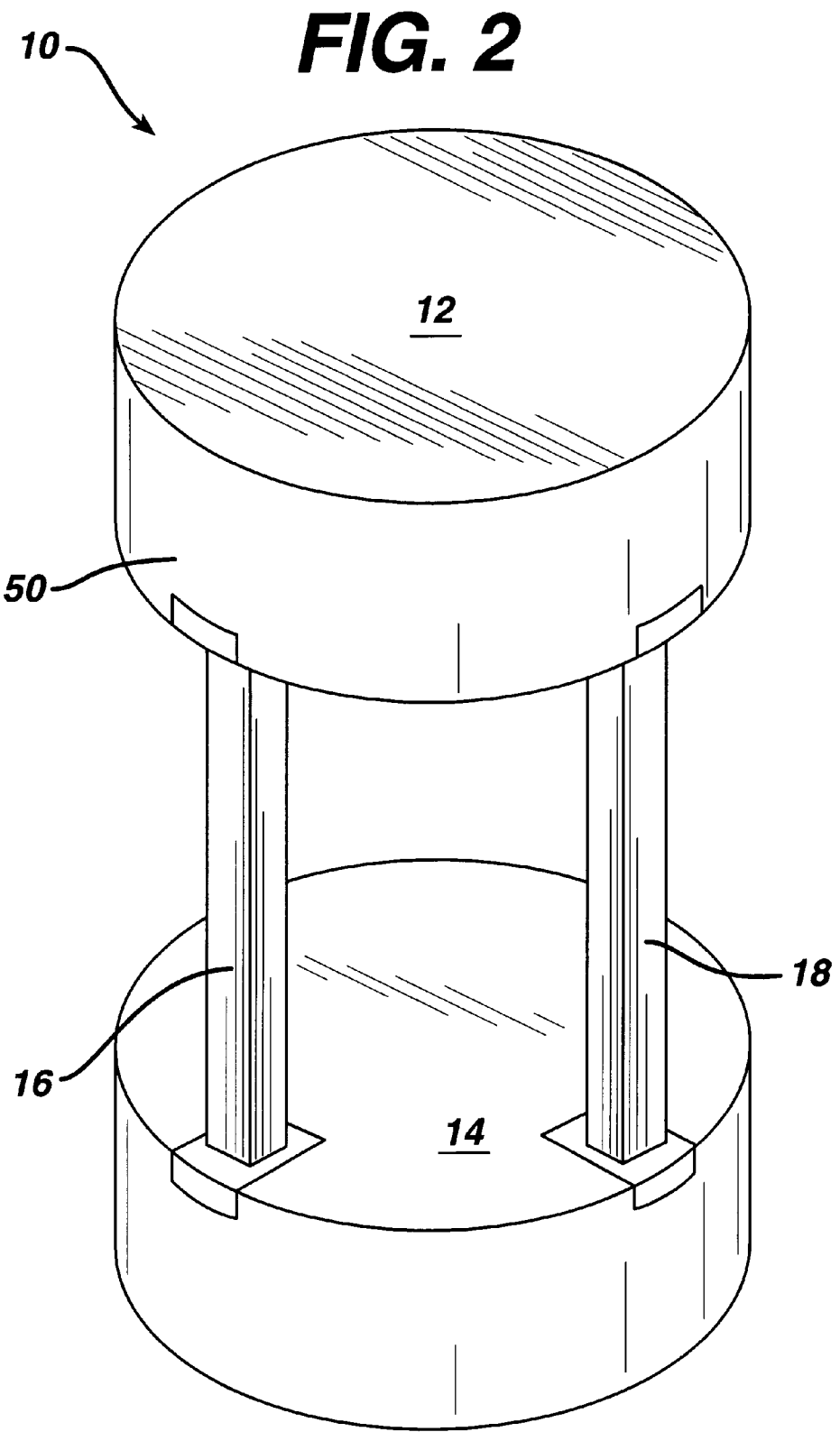
FIG. 2 is a schematic, perspective view of the magnet pole piece assembly of the open magnet of FIG. 1.
Figure 3:
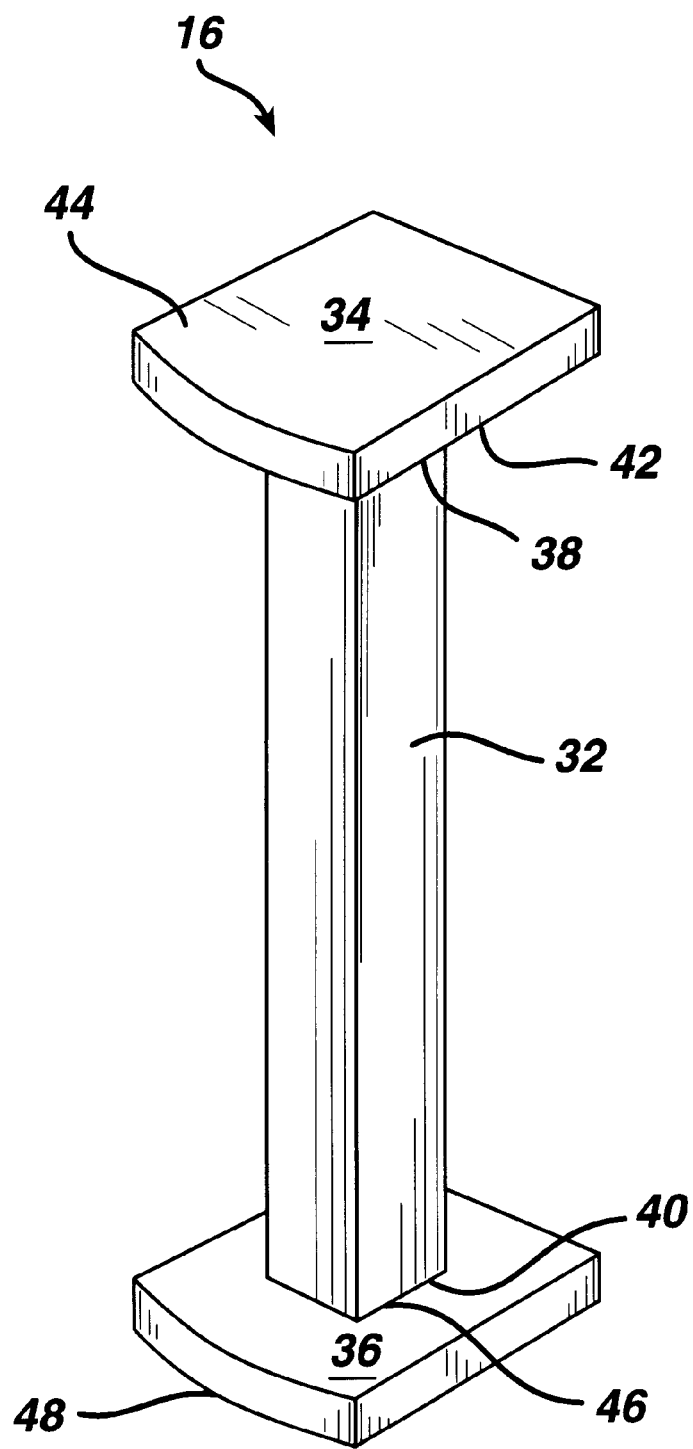
FIG. 3 is a schematic, perspective view of one of the support members of the magnet pole piece assembly of FIG. 2.

Referring now to the drawings, wherein like numerals represent like elements throughout, FIGS. 1–4 show a first embodiment of the present invention. In a first expression of the invention, a magnet pole piece assembly 10 includes first and second magnet pole pieces 12 and 14 and at least one support member 16 and 18. The first magnet pole piece 12 has a longitudinally extending first axis 20 and includes at least one first surface recess 22 and 24. The second magnet pole piece 14 has a longitudinally extending second axis 26 generally coaxially aligned with the first axis 20, and the second magnet pole piece 14 is longitudinally spaced apart from the first magnet pole piece 12. The second magnet pole piece 14 includes at least one second surface recess 28 and 30 generally longitudinally aligned with and facing a corresponding one of the at least one first surface recess 22 and 24.

The at least one support member 16 and 18 includes a generally longitudinally-extending central segment 32 and first and second end segments 34 and 36. The central segment 32 has opposing first and second longitudinal ends 38 and 40. The first end segment 34 has a first region 42 which is spaced apart from the first magnet pole piece 12 and which is abuttingly and metallurgically attached to the first longitudinal end 38 of the central segment 32. By "abuttingly and metallurgically attached" is meant that the first longitudinal end 38 of the central segment 32 and the first end segment 34 are in close proximity and joined together with any metallurgical joining technique such as, but not limited to, powder metallurgy, welding, brazing, and the like. The first end segment 34 has a first portion 44 which is spaced apart from the first region 42, which is disposed within a corresponding one of the at least one first surface recess 22 and 24, and which is abuttingly and metallurgically attached to the first magnet pole piece 12. The second end segment 36 has a second region 46 which is spaced apart from the second magnet pole piece 14 and which is abuttingly and metallurgically attached to the second longitudinal end 40 of the central segment 32. The second end segment 36 has a second portion 48 which is spaced apart from the second region 46, which is disposed within a corresponding one of the at least one second surface recess 28 and 30, and which is abuttingly and metallurgically attached to the second magnet pole piece 14.

In one example, any one of the central segment 32 and the first and second end segments 34 and 36 of the at least one support member 16 and 18 has a higher yield strength than any one of the first and second magnet pole pieces 12 and 14. In one composition, the first and second magnet pole pieces 12 and 14, which of course are magnetizable pole pieces, consist essentially of 1006 low carbon steel, the first and second end segments 34 and 36 are magnetizable end segments and consist essentially of magnetizable steel (such as ASTM A514 steel), and the central segment 32 is a nonmagnetizable central segment and consists essentially of a nonmagnetic stainless steel (such as Inconel 718 or Nitronic 50 stainless steel). By "nonmagnetizable" is meant having a relative permeability equal to generally unity. "Relative permeability" is the ratio of magnetic flux density produced in a material to the value in free space produced by the same magnetic field strength. Examples of nonmagnetizable materials include aluminum, copper, nonmagnetic stainless steel, plastic, wood, etc. By "magnetizable" is meant having a relative permeability larger than generally unity. Examples of magnetizable materials include low carbon steel, permanent magnets, etc. In one construction, the first region 42 of the first end segment 34 of the at least one support member 16 and 18 is generally full-penetration welded to the first longitudinal end 38 of the central segment 32 of the at least one support member 16 and 18, and the second region 48 of the second end segment 36 of the at least one support member 16 and 18 is generally full-penetration welded to the second longitudinal end 40 of the central segment 32 of the at least one support member 16 and 18. In one application, for higher yield strength (especially for the weld material), the at least one support member 16 and 18 is a heat-treated at least one support member 16 and 18, meaning that the at least one support member 16 and 18 is heat treated after the first and second end segments 34 and 36 have been generally full-penetration welded to the first and second longitudinal ends 38 and 40 of the central segment 32. In one construction, the first portion 44 of the first end segment 34 of the at least one support member 16 and 18 is edge welded to the first magnet pole piece 12, and the second portion 48 of the second end segment 36 of the at least one support member 16 and 18 is edge welded to the second magnetizable pole piece 14.

In the embodiment shown in the figures, the second magnet pole piece 14 is generally identical to the first magnet pole piece 12, and the second end segment 36 of the at least one support member 16 and 18 is generally identical to the first end segment 34 of the at least one support member 16 and 18. In one design, the first magnet pole piece 12 has a shape of a generally cylindrical disk having a circumference 50, and the at least one support member 16 and 18 consists of generally identical first and second support members 16 and 18 radially disposed between generally 110 and 150 degrees apart (and in one case generally 130 degrees apart). In one construction, the at least one first surface recess 22 and 24 of the first magnet pole piece 12 is open to the circumference 50, and the first end segment 34 extends generally in opposite circumferential directions beyond the central segment 32. Having the at least one first surface recess 22 and 24 be open to the circumference 50 allows the at least one support member 16 and 18 to be inserted, by a purely radially inward motion, into the corresponding one of the at least one first surface recess 22 and 24 of the first magnet pole piece 12.

In a second expression of the invention, an open magnet 52 includes first and second assemblies 54 and 56 and a first support member 16. The first assembly 54 includes a longitudinally-extending and generally-vertically-aligned first axis 20, at least one main coil 58, and a first magnet pole piece 12. It is noted that first axis 20 is a longitudinally-extending axis of both the first assembly 54 and the first magnet pole piece 12 as previously described in the first expression of the invention. The at least one main coil 58 is generally coaxially aligned with the first axis 20 and carries a first main electric current in a first direction. The first direction is defined to be either a clockwise or a counter-clockwise circumferential direction about the first axis 20 with any slight longitudinal component of current direction being ignored. The first magnet pole piece 12 is generally coaxially aligned with the first axis 20, is spaced apart from the at least one main coil 58 of the first assembly 54, and includes a first surface recess 22.

The second assembly 56 is longitudinally spaced apart from the first assembly 54 and includes a longitudinally-extending second axis 26, at least one main coil 60, and a second magnet pole piece 14. It is noted that second axis 26 is a longitudinally-extending axis of both the second assembly 56 and the second magnet pole piece 14 as previously described in the first expression of the invention, and that the second axis 26 is generally coaxially aligned with the first axis 20. The at least one main coil 60 is generally coaxially aligned with the second axis 26 and carries a second main electric current in the previously-described first direction. The second magnet pole piece 14 is generally coaxially aligned with the second axis 26, is spaced apart from the at least one main coil 60 of the first assembly 54, and includes a second surface recess 28.

The first support member 16 includes a generally longitudinally-extending central segment 32 and first and second end segments 34 and 36. The central segment 32 has opposing first and second longitudinal ends 38 and 40. The first end segment 34 has a first region 42 which is spaced apart from the first magnet pole piece 12 and which is abuttingly and metallurgically attached to the first longitudinal end 38 of the central segment 32. The first end segment 34 has a first portion 44 which is spaced apart from the first region 42, which is disposed within the first surface recess 22, and which is abuttingly and metallurgically attached to the first magnet pole piece 12. The second end segment 36 has a second region 46 which is spaced apart from the second magnet pole piece 14 and which is abuttingly and metallurgically attached to the second longitudinal end 40 of the central segment 32. The second end segment 36 has a second portion 48 which is spaced apart from the second region 46, which is disposed within the second surface recess 28, and which is abuttingly and metallurgically attached to the second magnet pole piece 14.

In one example, any one of the central segment 32 and the first and second end segments 34 and 36 of the at least one support member 16 and 18 has a higher yield strength than any one of the first and second magnet pole pieces 12 and 14. In one composition, the first and second magnet pole pieces 12 and 14, which of course are magnetizable pole pieces, consist essentially of 1006 low carbon steel, the first and second end segments 34 and 36 are magnetizable end segments and consist essentially of magnetizable steel (such as ASTM A514 steel), and the central segment 32 is a nonmagnetizable central segment and consists essentially of a nonmagnetic stainless steel (such as Inconel 718 or Nitronic 50 stainless steel). In one construction, the first region 42 of the first end segment 34 of the first support member 16 is generally full-penetration welded to the first longitudinal end 38 of the central segment 32 of the first support member 16, and the second region 48 of the second end segment 36 of the first support member 16 is generally full-penetration welded to the second longitudinal end 40 of the central segment 32 of the first support member 16. In one application, the first support member 16 is a heat-treated first support member 16. In one construction, the first portion 44 of the first end segment 34 of the first support member 16 is edge welded to the first magnet pole piece 12, and the second portion 48 of the second end segment 36 of the first support member 16 is edge welded to the second magnetizable pole piece 14.

In the embodiment shown in the figures, the second magnet pole piece 14 is generally identical to the first magnet pole piece 12, and the second end segment 36 of the first support member 16 is generally identical to the first end segment 34 of the first support member 16. In one design, the first magnet pole piece 12 has a shape of a generally cylindrical disk having a circumference 50, and the magnet 52 also includes a second support member 18 which is generally identical to and generally parallel with the first support member 16 and which is radially disposed between generally 110 and 150 degrees apart from (and in one case generally 130 degrees apart from) the first support member 16. In one construction, the first surface recess 22 of the first magnet pole piece 12 is open to the circumference 50, and the first end segment 34 extends generally in opposite circumferential directions beyond the central segment 32. Having the first surface recess 22 be open to the circumference 50 allows the first support member 16 to be inserted, by a purely radially inward motion, into the first surface recess 22 of the first magnet pole piece 12. The first and second support members 16 and 18 may have solid or hollow interiors depending on strength requirements, as can be determined by the artisan.

In one construction, magnet 10 is a superconductive magnet wherein the at least one main coils 58 and 60 of the first and second assemblies 54 and 56 are superconductive coils. It is noted that additional main coils, shielding coils, and correction coils may be present, as is known to the artisan, but such coils have been omitted from the figures for clarity. Likewise, while only a vacuum enclosure 62 and 64 of the first and second assemblies 54 and 56 have been shown in FIG. 1, coil forms (if needed), thermal shields, and a cooling mechanism (such as a liquid helium vessel or other cryogenic liquid or gas vessel and/or a cryocooler) have been omitted from the figures but are well known to those skilled in the art. In an example, the open magnet 52 is a 0.5 or higher Tesla magnet.

In one design, the first and second magnet pole pieces 12 and 14 each have planar longitudinally-inward and longitudinally-outward facing surfaces. In another design, not shown, the longitudinally-inward facing surfaces are concave radially inward from the surface recesses to accommodate items such as gradient coils. In another design, not shown, the longitudinally-outward facing surfaces have a central concave region to save weight.

Several benefits and advantages are derived from the invention. The design avoids a high stress joint between a support member and a lower-yield-strength pole piece. The central segment of the support member may have a higher-yield-strength, nonmagnetizable material, and the first and second end segments may have a higher-yield-strength, magnetizable material so that, for example, generally full-penetration welded attachments of the end segments to the central segment provide strong joints in areas subject to high stress. The end segments are supported in the surface recesses (and hence are not subject to high stress) of the lower-yield-strength, magnetizable pole pieces, so that, for example, an edge welded attachment of the end segments to the pole pieces may be used. The invention allows support for pole pieces weighing 5000 pounds and experiencing em-forces of 60,000 pounds with only two support members which can be radially positioned to allow for ease of patient access. The number and circumferential dimension of the support member or support members for a particular application will depend upon gravity and em-force strength requirements, as can be determined by the artisan.

The foregoing description of several expressions of an embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A magnet pole piece assembly comprising:
    a) a first magnet pole piece having a longitudinally extending first axis and including at least one first surface recess;

b) a second magnet pole piece, wherein said second magnet pole piece has a longitudinally extending second axis, wherein said second magnet pole piece is longitudinally spaced apart from said first magnet pole piece along said first axis and said second axis, and wherein said second magnet pole piece includes at least one second surface recess aligned with and facing a corresponding one of said at least one first surface recess; and c) at least one support member including:
  (1) a generally longitudinally-extending central segment having opposing first and second longitudinal ends;
  (2) a first end segment having a first region which is spaced apart from said first magnet pole piece and which is abuttingly and metallurgically attached to said first longitudinal end of said central segment, and having a first portion which is spaced apart from said first region, which is disposed within a corresponding one of said at least one first surface recess, and which is abuttingly and metallurgically attached to said first magnet pole piece; and
  (3) a second end segment having a second region which is spaced apart from said second magnet pole piece and which is abuttingly and metallurgically attached to said second longitudinal end of said central segment, and having a second portion which is spaced apart from said second region, which is disposed within a corresponding one of said at least one second surface recess, and which abuttingly and metallurgically attached to said second magnet pole piece.

2. The magnet pole piece assembly of claim 1, wherein any one of said central segment and said first and second end segments has a higher yield strength than any one of said first and second magnet pole pieces.

3. The magnet pole piece assembly of claim 1, wherein said central segment is a nonmagnetizable central segment, wherein said first and second end segments are magnetizable segments.

4. The magnet pole piece assembly of claim 3, wherein said central segment consists essentially of nonmagnetic stainless steel, wherein said first and second end segments consist essentially of magnetizable steel, and wherein said first and second magnet pole pieces consist essentially of magnetizable steel.

5. The magnet pole piece assembly of claim 1, wherein said first region of said first end segment is generally full-penetration welded to said first longitudinal end of said central segment, and wherein said second region of said second end contacts and cotacts with a full-penetration weld to said second longitudinal end of said central segment.

6. The magnet pole piece assembly of claim 1, wherein said at least one support member is of heat-treated material.

7. The magnet pole piece assembly of claim 1, wherein said first end portion of said at least one support abuts with weld to said first magnet pole piece, and wherein said second portion of said second end segment abuts with weld to said second magnet pole piece.

8. The magnet pole piece assembly of claim 1, wherein said second magnet pole piece and said first magnet pole piece, and wherein said second end segment and said first end segment are alike.

9. The magnet pole piece assembly of claim 1, wherein said first magnet pole piece has a shape of a cylindrical disk having a circumference, and wherein said at least one support member consists of first and second support members radially disposed between 110 and 150 degrees apart.

10. The magnet pole piece assembly of claim 9, wherein said at least one first surface recess is open to said circumference, and wherein said first end segment extends in opposite circumferential directions beyond said central segment.

11. An open magnet comprising:
a) a first assembly including:
  (1) a longitudinally-extending and generally-vertically-aligned first axis;
  (2) at least one main coil positioned around said first axis and carrying a first main electric current in a first direction; and
  (3) a first magnet pole piece positioned around said first axis, spaced apart from said at least one main coil of said first assembly, and including a first surface recess;
b) a second assembly longitudinally spaced apart from said first assembly and including:
  (1) a longitudinally-extending second axis generally positioned around said first axis;
  (2) at least one main coil positioned around said second axis and carrying a second main electric current in said first direction; and
  (3) a second magnet pole piece positioned around said second axis, spaced apart from said at least one main coil of said second assembly, and including a second surface recess longitudinally aligned with and facing said first surface recess; and
c) a first support member including:
  (1) a longitudinally-extending central segment having opposing first and second longitudinal ends;
  (2) a first end segment having a first region which is spaced apart from said first magnet pole piece and which abuttingly and metallurgically attached to said first longitudinal end of said central segment, and having a first portion which is spaced apart from said first region, which is disposed within said first surface recess, and which is abuttingly and metallurgically attached to said first magnet pole piece; and
  (3) a second end segment having a second region which is spaced apart from said second magnet pole piece and which is abuttingly and metallurgically attached to said second longitudinal end of said central segment, and having a second portion which is spaced apart from said second region, which is disposed within said second surface recess, and which is abuttingly and metallurgically attached to said second magnet pole piece.

12. The magnet of claim 11, wherein any one of said central segment and said first and second end segments has a higher yield strength than any one of said first and second magnet pole pieces.

13. The magnet of claim 11, wherein said central segment is a nonmagnetizable central segment, wherein said first and second end segments are magnetizable segments.

14. The magnet of claim 13, wherein said central segment consists essentially of nonmagnetic stainless steel, wherein said first and second end segments consist essentially of magnetizable steel, and wherein said first and second magnet pole pieces consist essentially of magnetizable steel.

15. The magnet of claim 11, wherein said first region of said first end segment abuts with weld to said first longitudinal end of said central segment, and wherein said second region of said second end segment abuts with weld to said second longitudinal end of said central segment.

16. The magnet of claim 11, wherein said first support member is of heat-treated material.

17. The magnet of claim 11, wherein said first portion of said first end segment abuts with weld to said first magnet pole piece, and wherein said second portion of said second end segment abuts with weld to said second magnet pole piece.

18. The magnet of claim 11, wherein said second magnet pole piece and said first magnet pole piece are alike, and wherein said second end segment and said first end segment are alike.

19. The magnet of claim 11, wherein said first magnet pole piece has a shape of a generally cylindrical disk having a circumference, and also including a second support member parallel with, and disposed between 110 and 150 degrees apart from, said first support member.

20. The magnet of claim 19, wherein said first surface recess is open to said circumference, and wherein said first end segment extends in opposite circumferential directions beyond said central segment.

* * * * *